(12) United States Patent
Tsai et al.

(10) Patent No.: US 6,849,932 B2
(45) Date of Patent: Feb. 1, 2005

(54) DOUBLE-SIDED THERMALLY ENHANCED IC CHIP PACKAGE

(75) Inventors: Chung-Che Tsai, Hsin Chu (TW); Wei-Heng Shan, Hsin Chu (TW)

(73) Assignee: Ultratera Corporation, Hsinchu (TW)

( * ) Notice: Subject to any disclaimer, the term of this patent is extended or adjusted under 35 U.S.C. 154(b) by 301 days.

(21) Appl. No.: 10/232,682

(22) Filed: Sep. 3, 2002

(65) Prior Publication Data

US 2004/0042140 A1 Mar. 4, 2004

(51) Int. Cl.[7] .............................................. H01L 23/495
(52) U.S. Cl. ...................................... 257/675; 257/777
(58) Field of Search .................................. 257/675, 686, 257/777, 666, 706, 779, 784, 785; 361/719

(56) References Cited

U.S. PATENT DOCUMENTS

| | | | |
|---|---|---|---|
| 5,355,283 A | | 10/1994 | Marrs et al. |
| 5,768,774 A | * | 6/1998 | Wilson et al. ................. 29/840 |
| 5,801,432 A | * | 9/1998 | Rostoker et al. ............ 257/666 |
| 6,127,724 A | * | 10/2000 | DiStefano ................... 257/675 |
| 6,380,615 B1 | | 4/2002 | Park et al. |
| 6,507,102 B2 | * | 1/2003 | Juskey et al. ................ 257/706 |
| 6,614,660 B1 | * | 9/2003 | Bai et al. ..................... 361/719 |
| 6,713,856 B2 | * | 3/2004 | Tsai et al. ................... 257/686 |

* cited by examiner

Primary Examiner—Long Pham
Assistant Examiner—(Vikki) Hoa B. Trinh
(74) Attorney, Agent, or Firm—Browdy and Neimark, P.L.L.C.

(57) ABSTRACT

The present invention is to provide a double-sided thermally enhanced IC chip package which includes a chip being received in an opening of a substrate and electrically connected to a conductive circuit pattern on a top surface of the substrate through bonding wires. A thermally and electrically conductive planar member is attached to an inactive side of the chip through a thermally and electrically conductive adhesive layer. A portion of an active side of the chip to which the bonding wires are connected is encapsulated by a dielectric encapsulant, and the other portion of the active side of the chip is covered by a thermally and electrically conductive encapsulant. Thus, heat generated by the chip can be efficiently dissipated through the planar member and the thermally and electrically conductive encapsulant. The present invention also discloses a stacked chip package with double-sided heat dissipation capability.

15 Claims, 5 Drawing Sheets

DOUBLE-SIDED THERMALLY ENHANCED IC CHIP PACKAGE

FIELD OF THE INVENTION

The present invention relates generally to an integrated circuit (IC) chip package, and more particularly to a low cost, high performance IC chip package with enhanced thermal capabilities through two sides.

BACKGROUND OF THE INVENTION

U.S. Pat. No. 5,355,283 discloses a prior art thermally enhanced IC chip package, which includes a substrate with a central hole. The substrate is bonded to a heat sink, which can be made of copper or other materials having an acceptably high thermal conductivity, by an adhesive such as an epoxy adhesive. An IC chip is also bonded to the heat sink by the adhesive within the central hole, which is subsequently filled with an encapsulant.

The presence of the heat sink in such a conventional IC chip package as described above can provide good heat transfer away from the chip, particularly since most of the heat sink surface is exposed to the exterior of the package. However, it has some drawbacks. The differences in coefficient of thermal expansion between the heat sink and the substrate create stress in the adhesive layer. This is exaggerated by differences in heating and cooling rates. The heat sink is heated directly by conduction through a relatively large area of an adhesive patch. The substrate is heated less directly by conduction through the heat sink and through the encapsulant. Thus, there are likely to be cyclical temperature differences that exaggerate differences in expansion due to differences in coefficient of thermal expansion. Moreover, the processes to implement an integral heat sink into the substrate are relatively complex and expansive.

Besides, there will have some problems on thermal capability when applying the above IC chip package to a stacked IC chip package, such as an embodiment disclosed in U.S. Pat. No. 6,380,615, the upper chip stacked on the other chip might not reach an efficient heat dissipation.

SUMMARY OF THE INVENTION

It is therefore the primary objective of the present invention to provide a double-sided thermally enhanced IC chip package which is free from the drawbacks of the prior art IC chip package.

It is another objective of the present invention to provide a double-sided thermally enhanced IC chip package having superior heat dissipation characteristics form both sides thereof and good electrical performance.

In keeping with the principle of the present invention, the forgoing objectives of the present invention are attained by the double-sided thermally enhanced IC chip package comprising a chip being received in an opening of a substrate and electrically connected to a conductive circuit pattern on a top surface of the substrate through bonding wires. A thermally and electrically conductive planar member is attached to an inactive side of the chip through a thermally and electrically conductive adhesive layer. A portion of an active side of the chip to which the bonding wires are connected is encapsulated by a dielectric encapsulant, and the other portion of the active side of the chip is covered by a thermally and electrically conductive encapsulant. Thus, heat generated by the chip can be efficiently dissipated through the planar member and the thermally and electrically conductive encapsulant.

In an embodiment of the present invention, the conductive circuit pattern on the top surface of the substrate has a ground end which is electrically connected to the thermally and electrically conductive encapsulant, thereby enhancing the electrical performance.

In another embodiment of the present invention, a stacked chip package with double-sided heat dissipation capability is disclosed, thereby heat generated by the stacked chips can be efficiently dissipated from both sides of the package.

In still another embodiment of the present invention, the conductive circuit pattern on the top surface of the substrate is covered by a solder mask layer on which a metal foil is covered. The metal foil is also covered by the thermally and electrically conductive encapsulant, thereby enhancing the heat dissipation.

The foregoing objectives, features, and advantages of the present invention will be more readily understood upon a thoughtful deliberation of the following detailed description of three preferred embodiments of the present invention with reference to the accompanying drawings.

DETAILED DESCRIPTION F THE INVENTION

Figure 1:
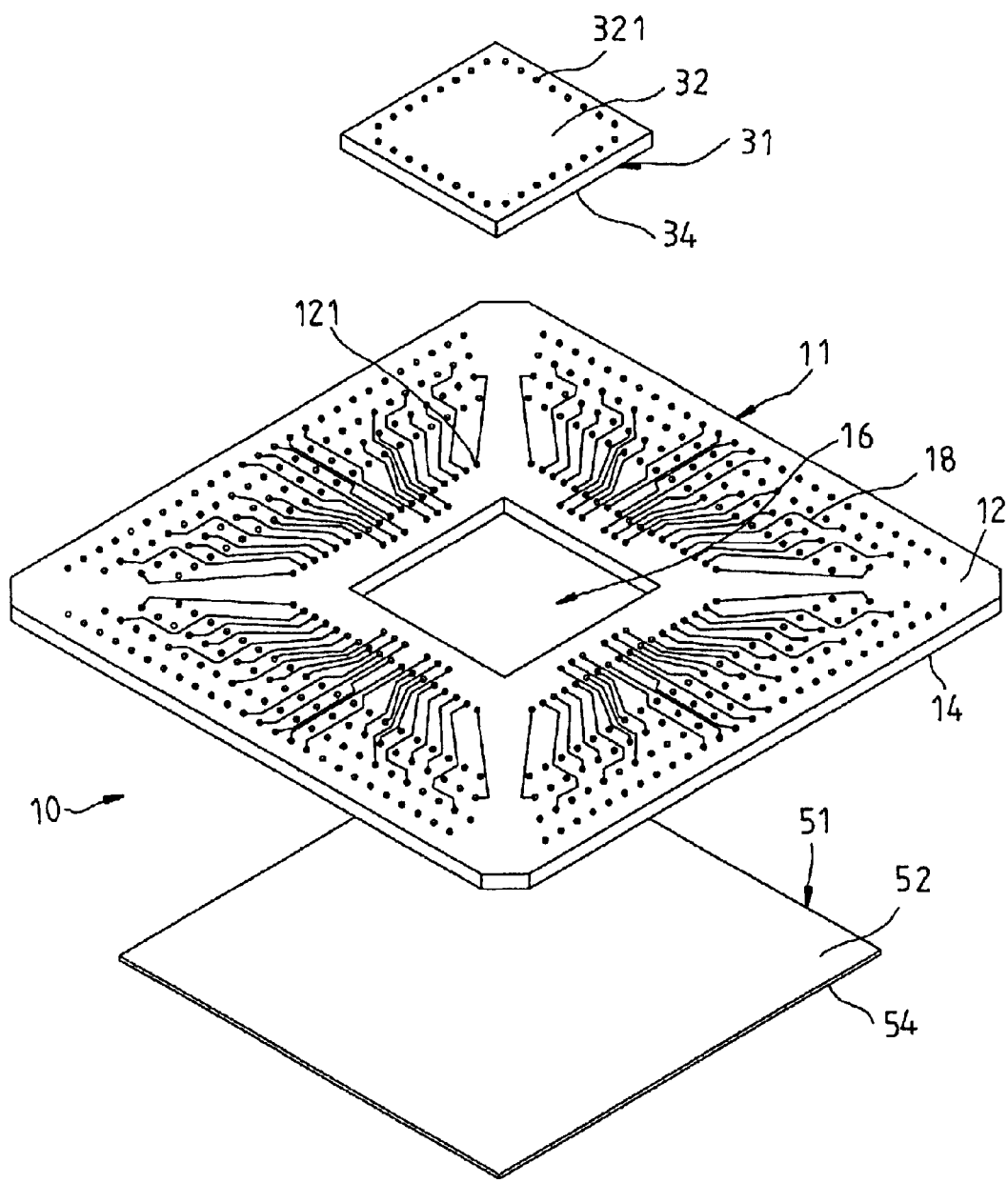
FIG. 1 is an exploded view of parts of an IC chip package constructed in accordance with a first preferred embodiment of the present invention, wherein only the substrate, the chip and the thermally and electrically conductive planar member are shown for illustration.
Figure 2:
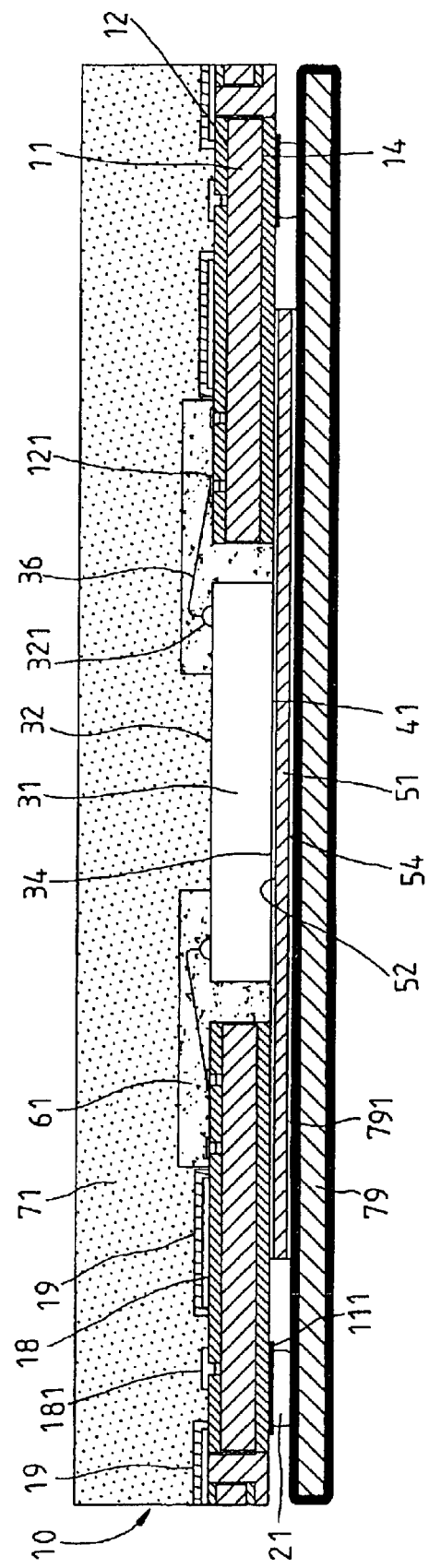
FIG. 2 is a sectional view of the first preferred embodiment of the present invention.
Figure 3:
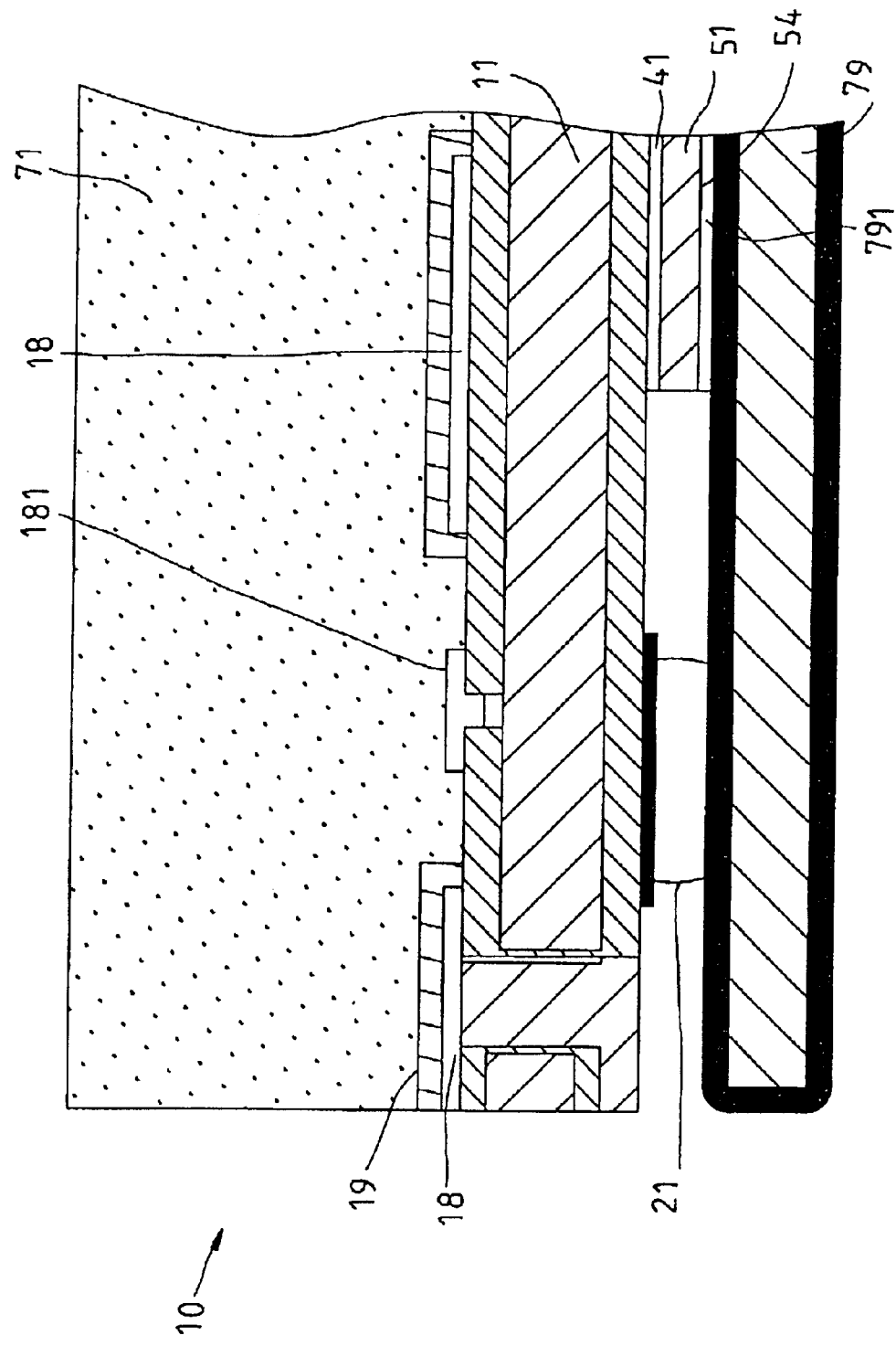
FIG. 3 is an enlarge view in part in FIG. 2.

As shown in FIGS. 1–3, there depict a first embodiment of a package 10 within the present invention. The package 10 includes a substrate or board 11 made of a suitable dielectric, or insulative, material such as fiberglass reinforced epoxy resin. The substrate 11 has a top and bottom surfaces 12, 14 on which a conductive circuit pattern 18 is respectively laid. The conductive circuit patterns 18 are electrically connected to each other through plated through holes (PTHs). A central window, or opening 16, of a particular size and shape, is formed through the thickness of the substrate 11. A solder mask layer 19 partially covers the circuit pattern 18 on the top surface 12 such that the ground ends 181 of the circuit pattern 18 on the top surface are exposed.

A plurality of solder balls 21 are attached at respective one of the mounting pads 111 of the conductive circuit pattern on the bottom surface 14.

An IC chip 31 has an active side 32 and an inactive side 34. The chip 31 is received in the opening 16. A plurality of bonding wires 36, e.g., gold wires, interconnect wire bonding pads 321 on the active side 32 of the chip 31 to respective one of the contact pads 121 of the conductive circuit pattern on the top surface 12 of the substrate 11.

A thermally and electrically conductive adhesive layer 41, e.g., a copper paste, is disposed on the inactive side 34 of the chip 31 and on the bottom surface 14 of the substrate 11 in a completely enclosing way around the opening 16.

A thermally and electrically conductive planar member 51, e.g., a copper thin plate, has a top surface 52 and a bottom surface 54. The member 51 is bonded to the thermally and electrically conductive adhesive layer 41 with the top surface 52 thereof.

A dielectric encapsulant 61 made of a thermosetting resin encapsulates the opening 16, the bonding wires 36, a portion of the active side 32 of the chip 31 to which the bonding wires are connected such that the wire bonding pads 321 on the active side 32 of the chip 31 are covered with the dielectric encapsulant, and a portion of the top surface 12 of the substrate 11 to which the bonding wires are connected such that the contact pads 121 on the top surface of the substrate 11 are covered with the dielectric encapsulant.

A thermally and electrically conductive encapsulant 71 made of a thermally and electrically conductive material, such as a copper paste, by printing technique, is covered over the encapsulant 61, the other portion of the active side 32 of the chip 31, and the other portion of the top surface 12 of the substrate 11 including the exposed solder mask layer 19 and the ground ends 181 of the circuit pattern 18 on the top surface such that the thermally and electrically conductive encapsulant 71 is electrically connected to the ground ends 181.

When being used, the package 10 is solder-mounted to a main, or "mother", board 79 by the solder balls 21 attached at the substrate 11. The bottom surface 54 of the thermally and electrically conductive planar member 51 is bonded to the main board 79 by an adhesive tape 791 made of thermally and electrically conductive material. This allows the heat generated by the chip 31 to be transferred directly through the thermally and electrically conductive planar member 51 to the main board 79 (the whole system) and to be transferred directly through the thermally and electrically conductive encapsulant 71 to outside also, i.e. both the top surface and bottom surface of the package 10 have good heat dissipation efficiency. And the electrical circuits of the package 10 is directly grounded to the main board 79 via the thermally and electrically conductive planar member 51, and also grounded to the thermally and electrically conductive encapsulant 71. As a result, the double-sided thermally enhanced IC package provided by the present invention has superior heat dissipation characteristics and good electrical performance. Furthermore, it will not exaggerate differences in expansion due to differences in coefficient of thermal expansion. It is to be noted that the ground ends of the conductive circuit pattern on the top surface of the substrate are electrically connected to the thermally and electrically conductive encapsulant in this preferred embodiment. However, it is to be understood that the ground ends will not be electrically connected to the thermally and electrically conductive encapsulant if they are covered by the solder mask layer.

Figure 4:
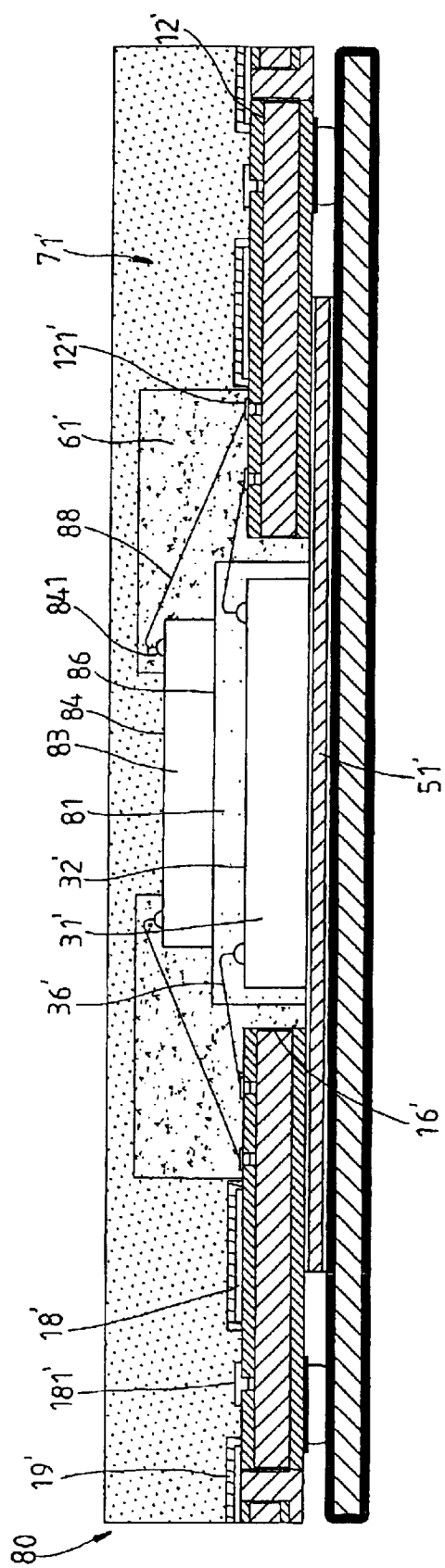
FIG. 4 is a sectional view of a second preferred embodiment of the present invention.

As shown in FIG. 4, a package 80 of a second preferred embodiment of the present invention is similar to that of the first preferred embodiment except that the second embodiment comprises a first and a second dielectric encapsulants 81, 61' and two chips 31', 83 stacked each other. The first dielectric encapsulant 81, which is made of a thermosetting resin, is covered over the active side 32' of the lower chip 31' and partially the bonding wires 36'. The upper chip 83 has an active side 84 and an inactive side 86. The upper chip 83 is attached to the dielectric encapsulant 81 with the inactive side 86 thereof when the dielectric encapsulant has not been hardened. A plurality of bonding wires 88, e.g., gold wires, interconnect wire bonding pads 841 on the active side 84 of the upper chip 83 to respective one of the contact pads 121' on the top surface 12' of the substrate 11'. The second dielectric encapsulant 61' encapsulates the opening 16', the chip 31' and the bonding wires 88, 36', a portion of the active side 84 of the upper chip 83 to which the bonding wires 88 are connected such that the wire bonding pads 841 of the upper chip 83 are covered with the encapsulant, and a portion of the top surface of the substrate to which the bonding wires 36', 88 are connected such that the contact pads 121' of the substrate 11' are also covered with the dielectric encapsulant. The thermally and electrically conductive encapsulant 71' made of a copper paste by printing technique is covered over the second dielectric encapsulant 61', the other portion of the active side of the upper chip 83, and the other portion of the top surface 12' of the substrate 11' including the exposed solder mask layer 19' and the ground ends 181' of the circuit pattern 18' such that the ground ends are electrically connected to the thermally and electrically conductive encapsulant. This second embodiment allows the heat generated by the chip 31' to be transferred directly through the thermally and electrically conductive planar member 51 to the main board (the whole system) and allows the heat generated by the upper chip 83 to be transferred directly through the thermally and electrically conductive encapsulant 71' to outside.

Figure 5:
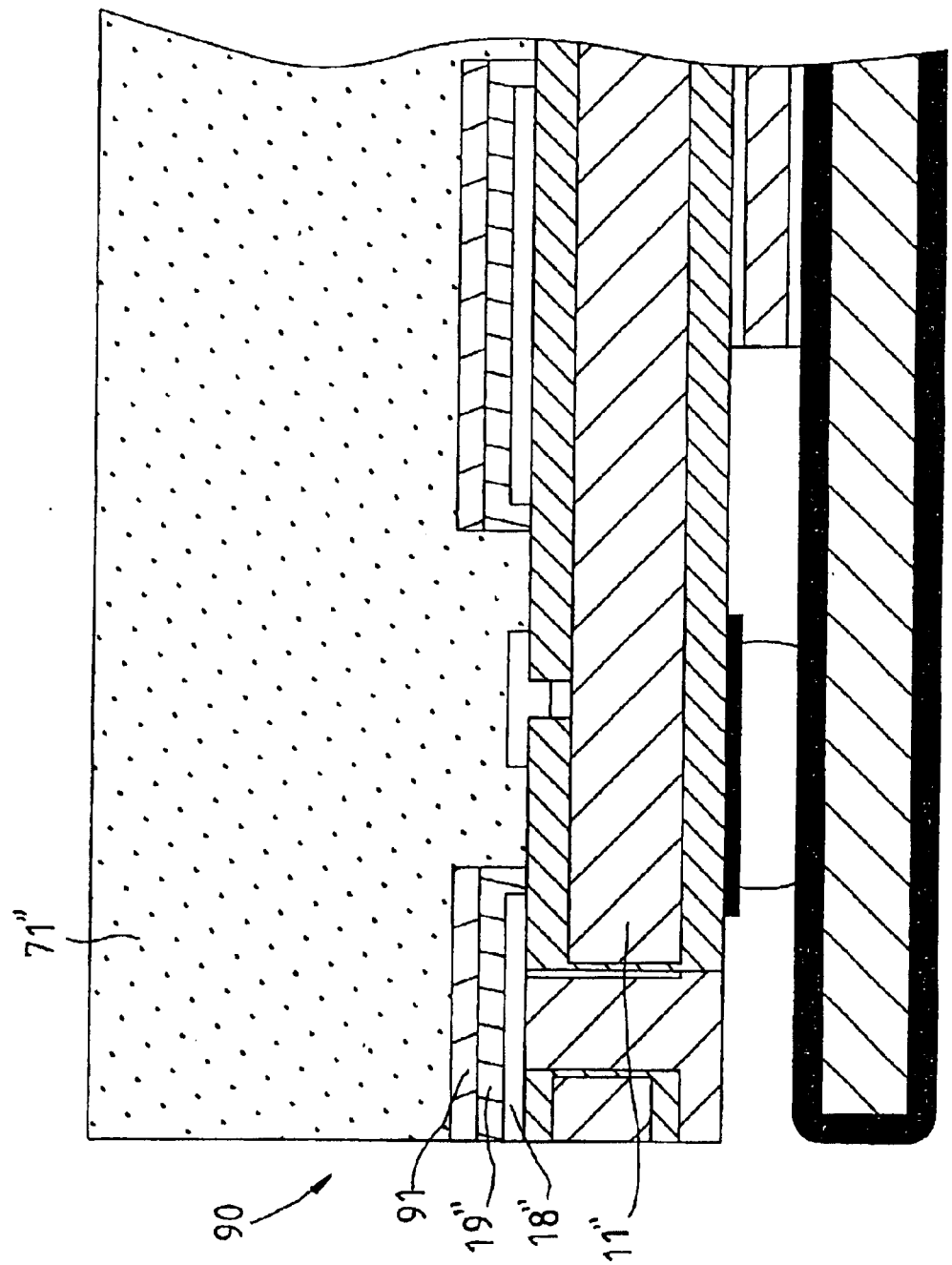
FIG. 5 is a sectional view of a third preferred embodiment of the present invention.

As shown in FIG. 5, a package 90 of a third preferred embodiment of the present invention is similar to that of the first preferred embodiment except that the third embodiment further comprises a metal foil 91 which covers the solder mask layer 19". The thermally and electrically conductive encapsulant 71" encapsulates the metal foil. The metal foil 91 enhances the heat dissipation efficiency of the circuit pattern 18" on the substrate 11".

In conclusion, the present invention allows the heat generated by chip in the package being transferred through the thermally and electrically conductive planar member 51, and through the thermally and electrically conductive encapsulant 71 also. The present invention has the effect of heat dissipation by both sides of the package, which is better than the prior art.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An IC chip package comprising:

a substrate having a top and bottom surfaces on which conductive circuit patterns are respectively laid, and an opening extended from the top surface to the bottom surface;

an IC chip having an active side and an inactive side, said chip being received in said opening of said substrate in such a way that said active side of said chip and said top surface of said substrate face to a same direction, said active side of the chip being electrically connected to the conductive circuit pattern on the top surface of said substrate through bonding wires;

a thermally and electrically conductive adhesive layer disposed on said inactive side of said chip and on said bottom surface of said substrate in a completely enclosing way around said opening;

a thermally and electrically conductive planar member having a top and bottom surfaces, said planar member being attached to said thermally and electrically conductive adhesive layer with said top surface thereof;

a dielectric encapsulant encapsulating the opening, the bonding wires, a portion of the active side of the chip to which the bonding wires are connected, and a portion of the top surface of the substrate to which the bonding wires are connected; and a thermally and electrically conductive encapsulant covered over the dielectric encapsulant, the other portion of the active side of the chip, and the other portion of the top surface of the substrate.

2. The IC chip package of claim 1, wherein further comprises a plurality of solder balls being electrically connected to the conductive pattern on said bottom surface of said substrate.

3. The IC chip package of claim 1, wherein the conductive circuit pattern on the top surface of the substrate has a ground end which is covered by the thermally and electrically conductive encapsulant such that the ground end is electrically connected to the thermally and electrically conductive encapsulant.

4. The IC chip package of claim 3, wherein the conductive circuit pattern on the top surface of the substrate is partially covered by a solder mask layer on which a metal foil is covered.

5. The IC chip package of claim 1, wherein said thermally and electrically conductive planar member is a copper plate.

6. The IC chip package of claim 1, wherein said thermally and electrically conductive adhesive layer is a copper paste.

7. The IC chip package of claim 1, wherein said thermally and electrically conductive encapsulant is made of a copper paste.

8. An IC chip package comprising:

a substrate having a top and bottom surfaces on which conductive circuit patterns are respectively laid, and an opening extended from the top surface to the bottom surface;

a lower IC chip having an active side and an inactive side, said chip being received in said opening of said substrate in such a way that said active side of said chip and said top surface of said substrate face to a same direction, said active side of the chip being electrically connected to the conductive circuit pattern on the top surface of said substrate through bonding wires;

a thermally and electrically conductive adhesive layer disposed on said inactive side of said chip and on said bottom surface of said substrate in a completely enclosing way around said opening;

a thermally and electrically conductive planar member having a top and bottom surfaces, said planar member being attached to said thermally and electrically conductive adhesive layer with said top surface thereof;

a first dielectric encapsulant covered on the active side of the lower IC chip;

an upper IC chip having an active side and an inactive side bonded to said first dielectric encapsulant, said active side of the upper IC chip being electrically connected to the conductive circuit pattern on the top surface of said substrate through another bonding wires;

a second dielectric encapsulant encapsulating the opening, the lower IC chip, the bonding wires, a portion of the active side of the upper IC chip to which the bonding wires are connected, and a portion of the top surface of the substrate to which the bonding wires are connected;

a thermally and electrically conductive encapsulant covered over the second dielectric encapsulant, the other portion of the active side of the upper chip, and the other portion of the top surface of the substrate.

9. The IC chip package of claim 8 further comprising a plurality of solder balls being electrically connected to the conductive pattern on said bottom surface of said substrate.

10. The IC chip package of claim 8, wherein the conductive circuit pattern on the top surface of the substrate has a ground end which is covered by the thermally and electrically conductive encapsulant such that the ground end is electrically connected to the thermally and electrically conductive encapsulant.

11. The IC chip package of claim 10, wherein the conductive circuit pattern on the top surface of the substrate is partially covered by a solder mask layer on which a metal foil is covered.

12. The IC chip package of claim 8, wherein said thermally and electrically conductive planar member is a copper plate.

13. The IC chip package of claim 8, wherein said thermally and electrically conductive adhesive layer is a copper paste.

14. The IC chip package of claim 8, wherein said thermally and electrically conductive encapsulant is made of a copper paste.

15. The IC chip package of claim 8, wherein the first dielectric encapsulant encapsulates the lower IC chip.

* * * * *